US009780040B1

(12) United States Patent
Tan et al.

(10) Patent No.: US 9,780,040 B1
(45) Date of Patent: Oct. 3, 2017

(54) INTEGRATED CIRCUIT PACKAGE SUBSTRATES HAVING A COMMON DIE DEPENDENT REGION AND METHODS FOR DESIGNING THE SAME

(71) Applicant: Altera Corporation, San Jose, CA (US)

(72) Inventors: Siow Chek Tan, Gurun (MY); Swee Fong Chong, Balik Pulau (MY); Pheak Ti Teh, Tanjung Bungah (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/454,115

(22) Filed: Aug. 7, 2014

(51) Int. Cl.
*G06F 17/50* (2006.01)
*H01L 23/498* (2006.01)
*H01L 23/538* (2006.01)
*H01L 23/00* (2006.01)

(52) U.S. Cl.
CPC ...... *H01L 23/5386* (2013.01); *G06F 17/5077* (2013.01); *H01L 24/14* (2013.01); *H01L 2224/14131* (2013.01)

(58) Field of Classification Search
CPC ............... G06F 17/5045; G06F 17/505; G06F 17/5054; G06F 17/5068; G06F 17/5072; G06F 17/5077
USPC ....... 257/678, 692, 697, 698, 701, 773, 776, 257/777, 778, 779, 780, 781, 782, 784, 257/786; 438/106, 108, 125, 612
See application file for complete search history.

(56) References Cited

U.S. PATENT DOCUMENTS

| | | | | |
|---|---|---|---|---|
| 5,585,676 A | * | 12/1996 | Uda | H01L 23/50 257/692 |
| 6,048,753 A | * | 4/2000 | Farnworth | H01L 23/49827 257/E21.511 |
| 6,297,565 B1 | * | 10/2001 | Shiflet | H01L 23/49838 257/692 |
| 6,308,307 B1 | | 10/2001 | Cano et al. | |
| 6,407,450 B1 | * | 6/2002 | Verma | H01L 23/49838 257/697 |
| 6,502,231 B1 | | 12/2002 | Pang et al. | |
| 6,528,351 B1 | | 3/2003 | Nathan et al. | |
| 6,725,443 B1 | | 4/2004 | Pang et al. | |
| 7,331,022 B1 | * | 2/2008 | Pritchard | G06F 17/5072 716/126 |
| 7,984,411 B2 | | 7/2011 | Waller | |

(Continued)

*Primary Examiner* — Marc Armand
*Assistant Examiner* — Younes Boulghassoul
(74) *Attorney, Agent, or Firm* — Vineet Dixit

(57) ABSTRACT

Techniques for designing integrated circuit (IC) package substrates are provided. One of the provided techniques include routing a first set of interconnects in a first region of an IC package substrate based on a first routing template and routing a second set of interconnects in a second region of the IC package substrate based on a second routing template. The first routing template is associated with output pins on the IC package substrate while the second routing template is associated with interconnects on at least one IC die of the multiple IC dies. In one scenario, the first routing template is a common routing template. As such, when a different IC die is used with an identical, or otherwise similar, IC package substrate, interconnects associated with output pins on that IC package substrate does not need to be rerouted as they may be routed based on the common routing template.

15 Claims, 7 Drawing Sheets

(56) References Cited

U.S. PATENT DOCUMENTS

| | | | |
|---|---|---|---|
| 9,204,543 B2* | 12/2015 | Ossimitz | H01L 23/49838 |
| 2005/0077602 A1* | 4/2005 | Hall | G06F 17/5068 |
| | | | 257/678 |
| 2007/0114644 A1* | 5/2007 | Miller | H01L 23/49816 |
| | | | 257/678 |
| 2007/0164784 A1* | 7/2007 | Charagulla | H03K 19/17744 |
| | | | 326/41 |
| 2013/0181257 A1* | 7/2013 | Ngai | H03K 19/17744 |
| | | | 257/209 |

\* cited by examiner

INTEGRATED CIRCUIT PACKAGE SUBSTRATES HAVING A COMMON DIE DEPENDENT REGION AND METHODS FOR DESIGNING THE SAME

BACKGROUND

An integrated circuit (IC) die is generally encased in a package to protect the die from external contaminants or physical damage. In an IC package, the die is typically mounted on a substrate and may be encapsulated in a molding compound. Signals from the die are routed to the package substrate and are subsequently transmitted through the substrate to external circuitry (e.g., a printed circuit board that the IC package is mounted on) via solder balls mounted on the bottom surface of the package substrate. As such, a package designer needs to create a package design for the package substrate in order to route signals from the IC die (e.g., microbumps on the IC die and bump pads on the top surface of the package substrate) through the package substrate, and subsequently to the solder balls at the bottom surface of the package substrate.

Generally, an IC die may be packaged in different package configurations and a single package configuration may be used with different IC dies. In one scenario, depending on the number of components needed (e.g., on-chip capacitors, etc.), or the number of pins required by the user, a bigger or smaller package may be used. For example, if the user requires more input-output pins, a bigger package may be required as a bigger package can accommodate a higher number of input-output pins. Multiple IC packages of different sizes (or types) may therefore be used with a single die. Alternatively, the same IC package configuration or package substrate may be used with different IC dies. As an example, different IC dies (e.g., devices of different sizes) in the same family may use the same package configuration.

Generally, a package designer needs to create a new package design for each different package configuration. For example, to package the same type of IC die in three different packaging configurations (e.g., three packages of different sizes), the package designer may need to create three distinct package designs. Similarly, if a different IC die (e.g., a bigger or smaller device in the same family) is used with the same package configuration, the package designer may need to recreate a package design for that particular IC die.

Package design is typically a manual process that involves multiple steps including, among others, layout planning, physical routing, and testing. As such, it may require considerable effort and cost to create a wholly new package design for each device within the same family of devices. Furthermore, as each package is individually designed and tested, there may be performance variations across different package configurations even when the same IC die is used.

It is within this context that the embodiments described herein arise.

SUMMARY

Scalable integrated circuit (IC) packages and techniques for designing such packages are provided. Embodiments of the present invention include methods to create reusable design templates that may be adapted for different package configurations.

It is appreciated that the present invention can be implemented in numerous ways, such as a process, an apparatus, a system, a device or a computer readable medium. Several inventive embodiments of the present invention are described below.

A method of designing an integrated circuit package substrate that is adapted for use with multiple integrated circuit dies may include routing a first set of interconnects in a first region of the integrated circuit package substrate based on a first routing template that is associated with output pins on the integrated circuit package substrate.

The method may further include routing a second set of interconnects in a second region of the integrated circuit package substrate based on a second routing template that is different than the first routing template. The second routing template may be associated with interconnects on at least one of the multiple integrated circuit dies.

In one embodiment, the first routing template may be adapted for use with multiple integrated circuit dies. For example, if a different integrated circuit die (e.g., a smaller integrated circuit die) is to be used with the same, or otherwise identical, integrated circuit package substrate, the same routing template may be used to route interconnects associated with the output pins on that integrated circuit package substrate.

A method for designing multiple integrated circuit package substrates may include routing interconnects in a die dependent region of the integrated circuit package substrate based on an integrated circuit die to obtain a die dependent routing template. Accordingly, interconnects in a pin dependent region of each of the integrated circuit package substrates are routed to obtain pin dependent routing templates for the respective integrated circuit package substrates. In one embodiment, the die dependent routing template may be stored as a common routing template for the respective integrated circuit package substrates. As such, in one scenario, the die dependent routing template may be reused across the respective integrated circuit package substrates.

Integrated circuit package substrates adapted for use with an integrated circuit die may include a common region and a pin dependent region in each of the integrated circuit package substrates. The common region may include interconnects that correspond with interconnects on the integrated circuit die while the pin dependent region may include interconnects that correspond with output pins on a corresponding integrated circuit package substrate.

An integrated circuit package substrate that is adapted for use with multiple integrated circuit dies may include a common region and a die dependent region. The common region may have interconnects that correspond with output pins on the integrated circuit package substrate while the die dependent region may have interconnects that correspond with interconnects on one of the integrated circuit dies.

DETAILED DESCRIPTION

The embodiments provided herein include techniques to produce integrated circuit (IC) package design templates that may be adapted for use with different IC dies or packaging configurations.

It will be obvious, however, to one skilled in the art, that the present exemplary embodiments may be practiced without some or all of these specific details. In other instances, well-known operations have not been described in detail in order not to unnecessarily obscure the present embodiments.

Figure 1:
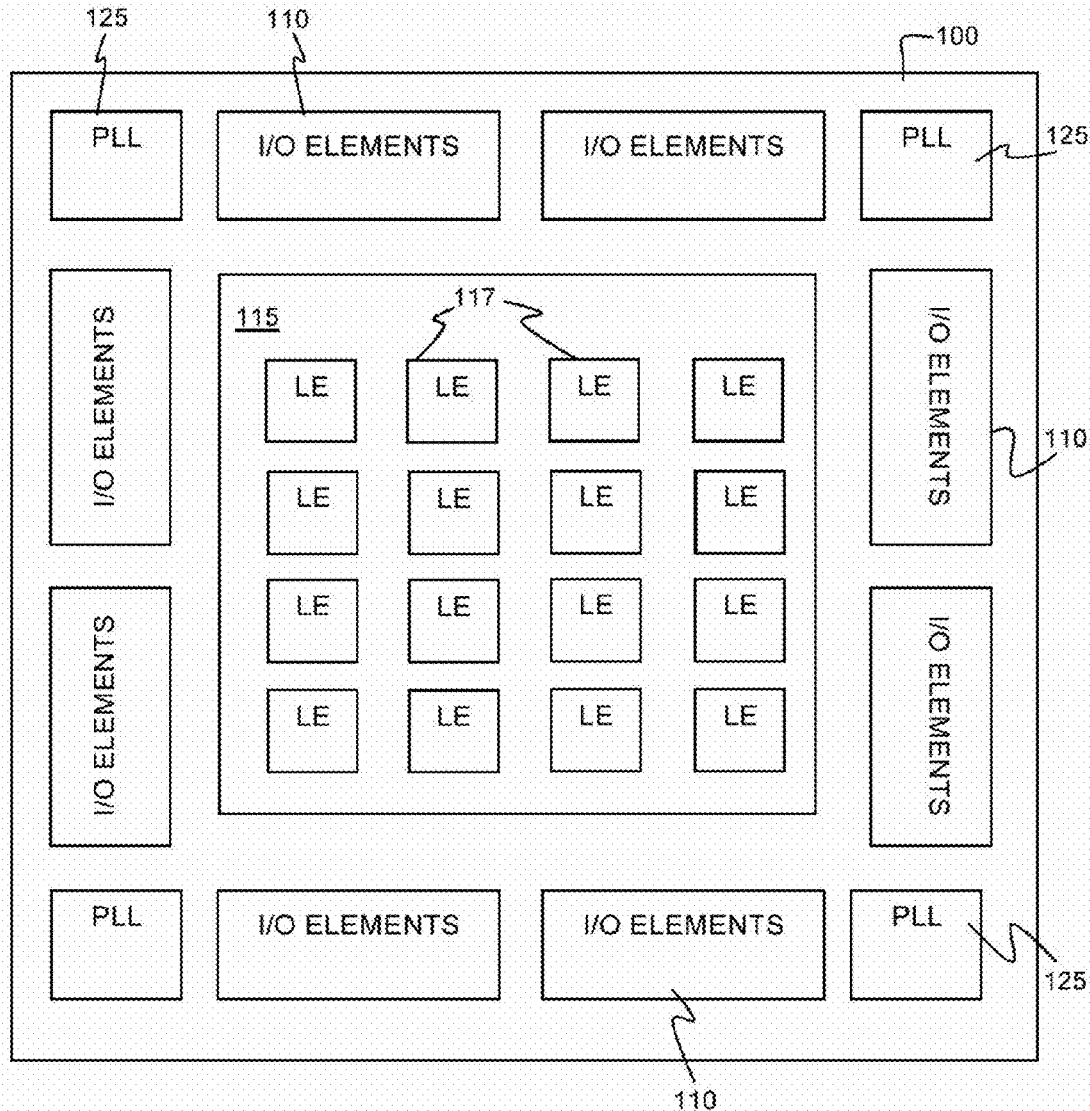
FIG. 1 is a simplified block diagram of an integrated circuit in accordance with embodiments of the present invention.

An IC device such as a field-programmable gate array (FPGA) device, generally includes, among others, memory modules, logic blocks, clock generation circuitry, and input-output elements. FIG. 1, meant to be illustrative and not limiting, shows a simplified block diagram of IC 100. IC 100 includes core logic region 115 and input-output elements 110. Other auxiliary circuits, such as phase-locked loops (PLLs) 125, for clock generation and timing, can be located outside core logic region 115 (e.g., at corners of IC 100 and adjacent to input-output elements 110).

Signals received from external circuitry at input-output elements 110 may be routed from input-output elements 110 to core logic region 115 or other logic blocks (not shown) on IC 100. Accordingly, signals may be sent from core logic region 115 and other relevant logic blocks of IC 100 to other external circuitry or components that may be connected to IC 100 through input-output elements 110. It should be noted that a single device like IC 100 can potentially support a variety of different interfaces and each individual input-output bank 110 may support a different input-output standard with a different interface or a different voltage level.

Core logic region 115 may be populated with logic cells that may include "logic elements" (LEs) 117, among other circuits. In one embodiment, LEs 117 may include look-up table-based logic regions and may be grouped into "Logic Array Blocks" (LABs). LEs 117 and groups of LEs or LABs may be configured to perform specific user functions. Configuration data loaded into configuration memory (not shown) may be used to produce control signals that configure LEs 117 and groups of LEs and LABs to perform the desired user functions.

Figure 2A:
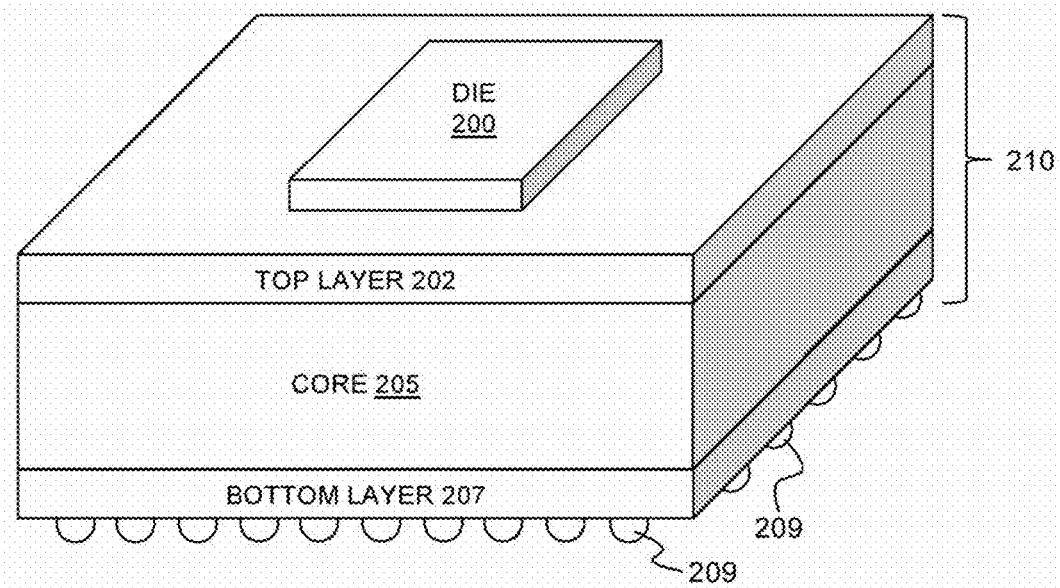
FIG. 2A shows an illustrative integrated circuit die disposed on a package substrate in accordance with embodiments of the present invention.

It should be noted that IC dies such as IC 100 may be packaged in different packaging configurations. As an example, depending on user requirements, IC 100 may be packaged in a bigger IC package (with a bigger package substrate) that is able to accommodate more input-output pins (assuming the user requires a device with a high number of input-output pins). Conversely, the same IC die (or an otherwise identical IC die) may be packaged in a smaller package substrate when fewer input-output pins are required. FIG. 2A shows illustrative IC die 200 disposed on package substrate 210 in accordance with embodiments of the present invention. It should be noted that the structure shown in FIG. 2A (and other structures shown in FIGS. 2B, 3 and 4) are merely illustrative and are not drawn to scale.

Before an IC die such as IC die 200 is packaged, a package designer generally needs to create a package design for the die and package substrate used based on various design rules. For example, the package designer may need to create a package layout or die floorplan for the package substrate. This may involve routing interconnects on the package substrate to connect input-output pins on the IC die to the pins on the package substrate. As shown in FIG. 2A, package substrate 210 may include top layer 202, core 205 and bottom layer 207. In the embodiment of FIG. 2A, core 205 is sandwiched between top layer 202 and bottom layer 207. It should be noted that in a multi-layer package substrate, the core layer may be sandwiched between multiple layers. However, for simplicity, additional layers (either above top layer 202 or below bottom layer 207) are not shown and only top layer 202, core 205 and bottom layer 207 are shown in FIG. 2A.

IC die 200 is disposed or mounted on top layer 202 of package substrate 210. Input-output pins (e.g., solder balls 209) may be formed on bottom layer 207 of package substrate 210. Interconnects (not shown) within package substrate 210 route signals from IC die 200 to solder balls 209 on the bottom layer 207 of package substrate 210. Generally, before IC die 200 is mounted on package substrate 210, a package designer may create a package design for package substrate 210. The package design may include routing connections that are adapted to work with IC die 200 (or other identical IC dies).

Generally, when either a different IC package substrate (e.g., a bigger or smaller IC package substrate) or a different IC die (e.g., a bigger or smaller IC die) is used, the package designer needs to recreate a complete package design for the package substrate. However, techniques disclosed herein may allow a portion of the package design to be reused such that the package designer may not need to recreate a complete package design when either a different IC package substrate or a different IC die is used.

In one scenario, when routing interconnects on an IC package substrate such as IC package substrate 210, a portion of the interconnects may be designated as die dependent interconnects while remaining interconnects may be designated as pin dependent interconnects. When the package designer designs or routes the die dependent interconnects, the resulting routing design may be saved as a die dependent template. Similarly, a pin dependent template may be generated when the package designer designs or routes the pin dependent interconnects.

The die dependent template may be a common routing template that can be reused across different IC package substrates. As an example, when a bigger package substrate (e.g., bigger than IC package substrate 210) is used with IC die 200, the package designer may use the common routing template to route a portion of interconnects (e.g., die dependent interconnects) in the IC package substrate. Alternatively, the pin dependent template may be a common routing template that can be used with different IC dies. For example, when a different die (e.g., a smaller die) is used with IC package substrate 210, the pin dependent template may be used to route the pin dependent interconnects on IC package substrate 210.

Figure 2B:
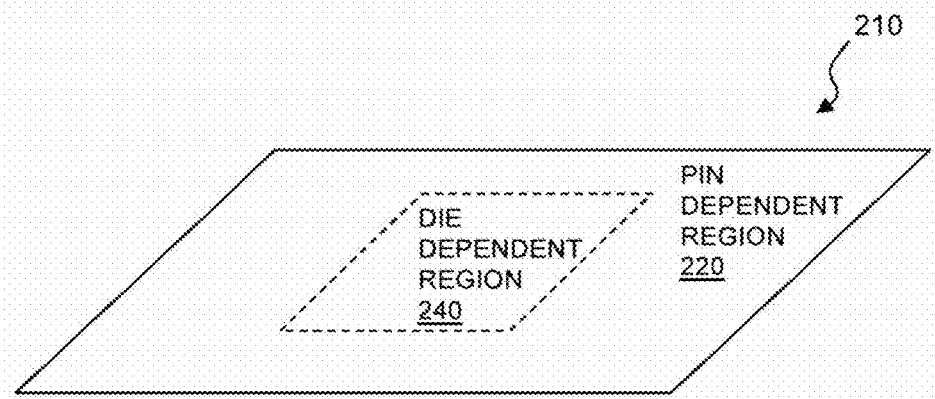
FIG. 2B shows a simplified top-down view of an integrated circuit package substrate with a die dependent region and a pin dependent region in accordance with embodiments of the present invention.

FIG. 2B shows a simplified top-down view of IC package substrate 210 with a die dependent region and a pin dependent region in accordance with embodiments of the present invention. Die dependent region 240 may have interconnects that correspond with interconnects (e.g., bump pads and microbumps) on an integrated circuit die while pin dependent region 220 may have interconnects (e.g., solder balls 209 shown in FIG. 2A) that correspond with output pins on IC package substrate 210. In one embodiment, a common routing template may be associated with the die dependent region (e.g., die dependent region 240) on the IC package substrate. In another embodiment, the common routing template may be associated with the pin dependent region (e.g., pin dependent region 220) on the IC package substrate.

Figure 3:
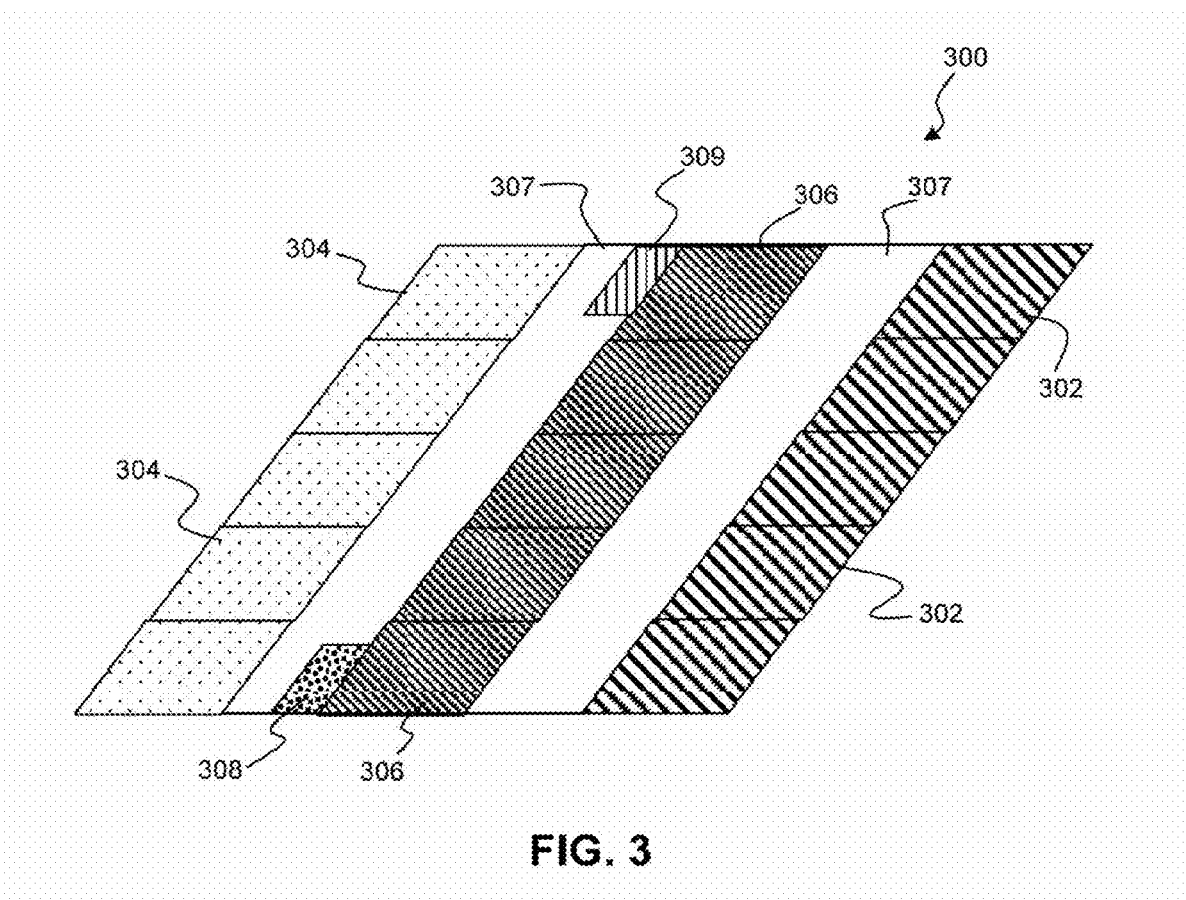
FIG. 3 shows an illustrative floorplan or routing template for an integrated circuit device with different types of logic blocks in accordance with embodiments of the present invention.

It should be noted that routing templates, or more specifically, die dependent routing templates, may be generated based on a floorplan for an IC die. FIG. 3 shows an illustrative floorplan for an IC device with different types of logic blocks in accordance with embodiments of the present invention. In one embodiment, when designing or routing interconnects on an IC die (e.g., IC 100 of FIG. 1), the package designer may route the interconnects based on logic blocks on the IC die. As an example, floorplan 300 of the IC die shown in FIG. 3 may include high-speed serial interface (HSSI) blocks 302, input-output blocks 304, memory blocks 306, core logic blocks 307, control block 308, and hard processor system (HPS) block 309. It should be noted that these are merely examples of possible logic blocks that may exist in an IC die and as such, for the sake of brevity, actual functionalities of these blocks are not described in detail herein in order to not unnecessarily obscure the present invention.

In one scenario, for each type of logic block in the IC die, the package designer may create a routing template for that particular logic block. In this scenario, the package designer does not need to route and reroute the same type of logic block and may only need to create a single routing template for each type of logic block in the IC die. Accordingly, the routing template for that logic block may then be reused or duplicated across the IC die for each logic block of the same type, as shown in FIG. 3. Individual routing templates for each type of logic blocks in the IC device may collectively form floorplan 300 that may then be used as a die dependent routing template for the IC die.

Figure 4:
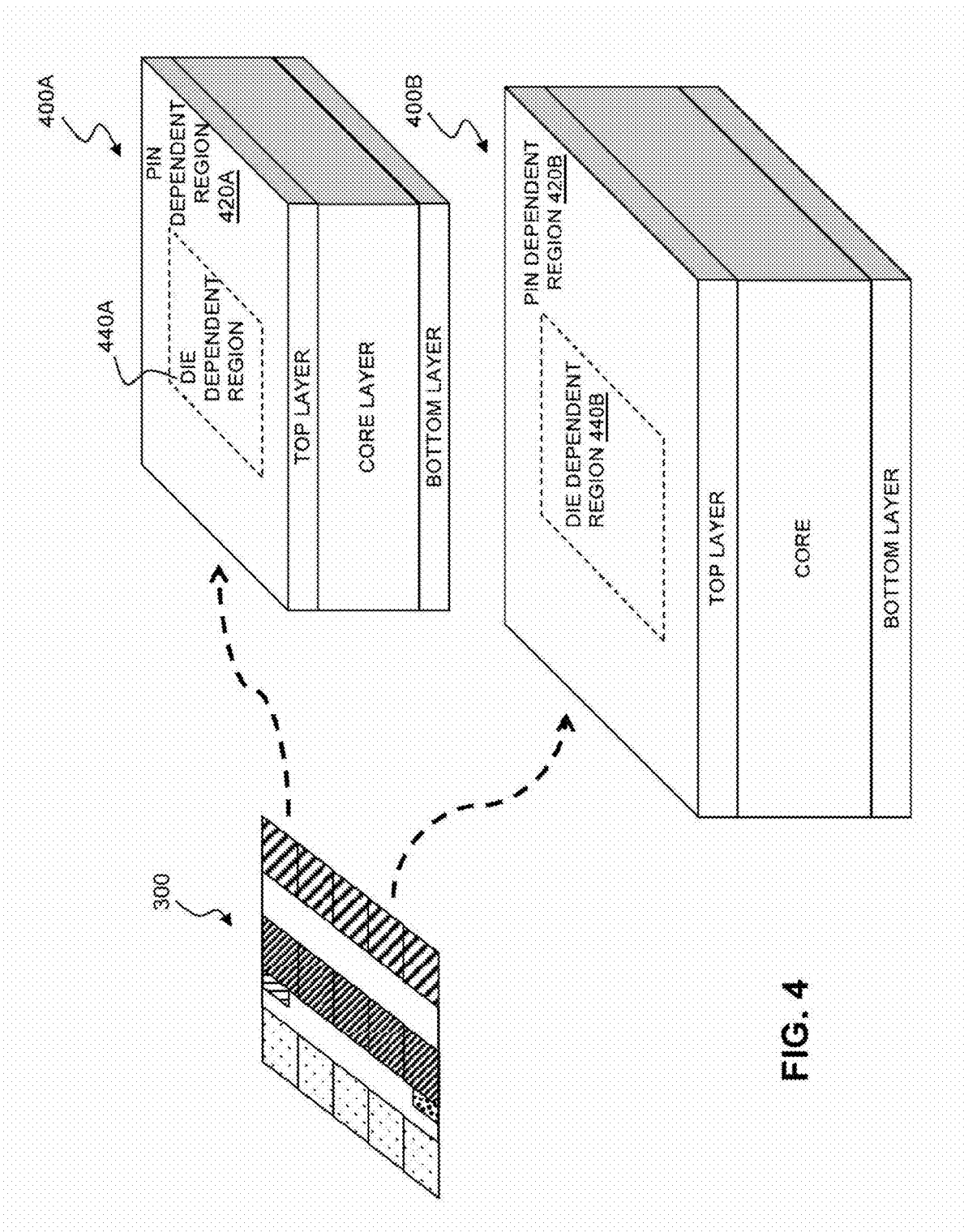
FIG. 4 shows how a die dependent routing template may be used with two different integrated circuit package substrates in accordance with embodiments of the present invention.

FIG. 4 shows how the die dependent routing template may be used with two different IC package substrates in accordance with embodiments of the present invention. In FIG. 4, each of IC package substrates 400A and 400B has a pin dependent region (e.g., pin dependent regions 420A and 420B) and a die dependent region (e.g., die dependent regions 440A and 440B). In one embodiment, interconnects in die dependent regions 440A and 440B may be routed based on an IC die that is associated with (or to be used with) IC package substrates 400A and 400B. As such, the surface area of die dependent regions 440A and 440B may correspond to the surface area of the IC die that is associated with IC package substrates 400A and 400B.

Generally, an IC die (or identical IC dies) may have different packaging configurations. In one embodiment, instead of completely rerouting all the interconnects for each packaging configuration, a die dependent template may be generated or created once and reused across the different packaging configurations. For example, interconnects in die dependent regions 440A and 440B in the respective IC package substrates 400A and 400B may be routed based on floorplan or routing template 300 of the IC die. In one scenario, therefore, each of IC package substrate 400A and 400B has a common region (e.g., die dependent region 440A and die dependent region 440B, respectively) with interconnects that correspond with interconnects on the IC die. As such, the respective interconnects in die dependent regions 440A and 440B may be routed based on a common routing template that can be used with both IC package substrates 400A and 400B.

Interconnects in the respective pin dependent regions 420A and 420B may correspond with output pins on their respective IC package substrates 400A and 400B. Accordingly, instead of using a common routing template, interconnects in pin dependent regions 420A and 420B may need to be routed independently to obtain individual pin dependent routing templates for respective IC package substrates 400A and 400B. For example, IC package substrate 400B may have a larger surface area compared to IC package substrate 400A or may have a higher number of output pins (e.g., a higher number of solder balls on the IC package substrate). As such, the routing template for pin dependent region 420B may be different from the routing template for pin dependent region 420A, as pin dependent regions 420A and 420B may be of different sizes.

Figure 5:
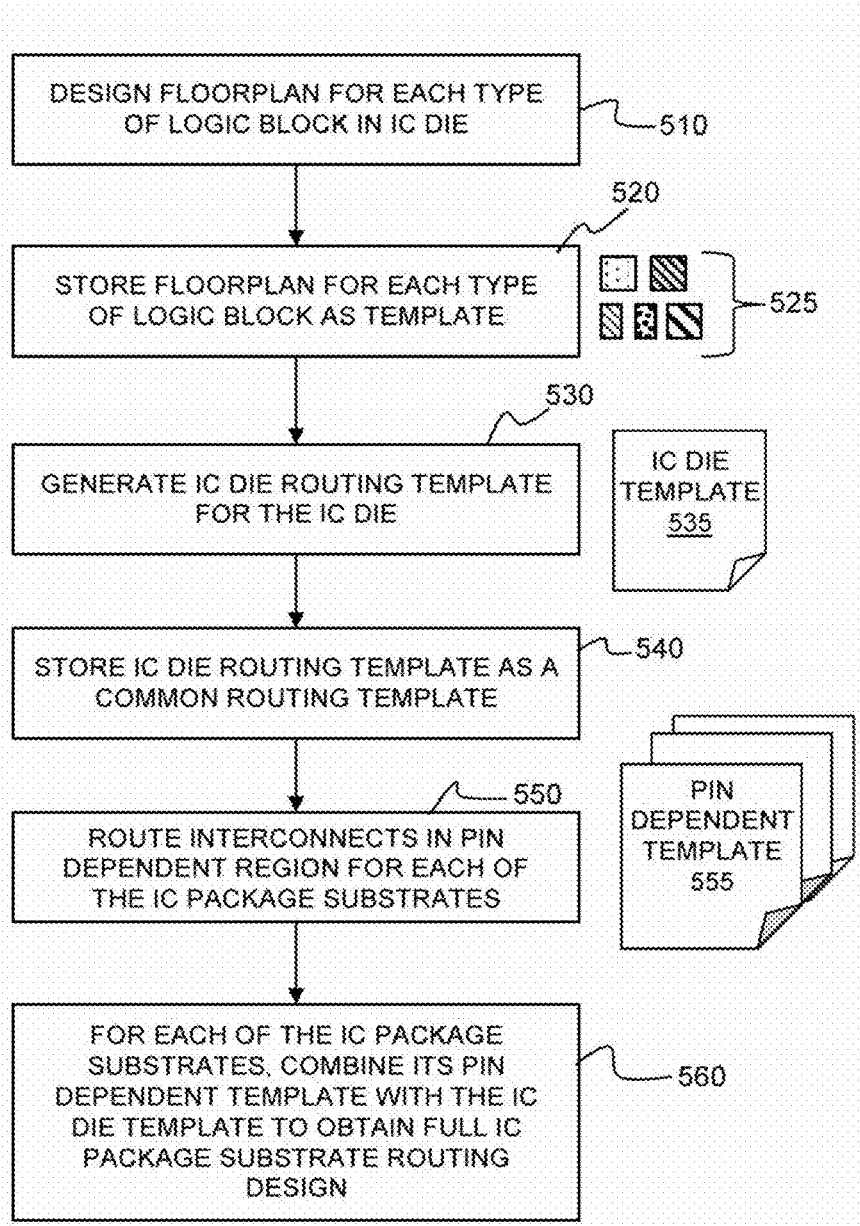
FIG. 5 shows illustrative steps for designing or routing interconnects for an integrated circuit die in different integrated circuit package substrates in accordance with embodiments of the present invention.

FIG. 5 shows illustrative steps for designing or routing interconnects in different IC package substrates for an IC die in accordance with embodiments of the present invention. It should be noted that a package designer may perform some or all of the steps in FIG. 5 when packaging an IC die in different packaging configurations as described above with reference to FIG. 4. In one scenario, each of the different IC package substrates may have a die dependent region that is common for that particular IC die across the different IC package substrates, and a pin dependent region. At step 510, the package designer may identify the types of logic blocks in the IC die and may accordingly generate or design a floorplan for each type of logic block connection on the IC die. The floorplan for each type of logic block may be stored as templates (e.g., templates 525 for the different types of logic blocks).

At step 530, a floorplan or routing template (e.g., IC die routing template 535) is generated for the IC die. In one embodiment, IC die template 535 is generated based on the templates 525 for the respective logic blocks in the IC die. Next, IC die routing template 535 may be stored as a common routing template at step 540. In one embodiment, the common routing template may be used with different IC package substrates. For example, the common routing template may be used to route interconnects in die dependent regions 440A and 440B in respective IC package substrates 400A and 400B, as shown in FIG. 4.

At step 550, the package designer may route interconnects in the pin dependent region of each of the IC package substrates to obtain individual pin dependent routing templates 555 for the respective IC package substrates. At step 560, the pin dependent routing template 555 for each of the IC package substrates is combined with IC die routing template 535 (or a common die dependent routing template) to obtain a full IC package substrate routing design for that IC package substrate. Thus, instead of completely routing all the interconnects in each of the IC package substrates, the package designer may route only a portion of interconnects (e.g., pin dependent interconnects) in each of the IC package substrates when an identical IC die is used as the IC package substrates share a common die dependent routing template (e.g., IC die routing template 535) that the package designer can reuse.

Figure 6:
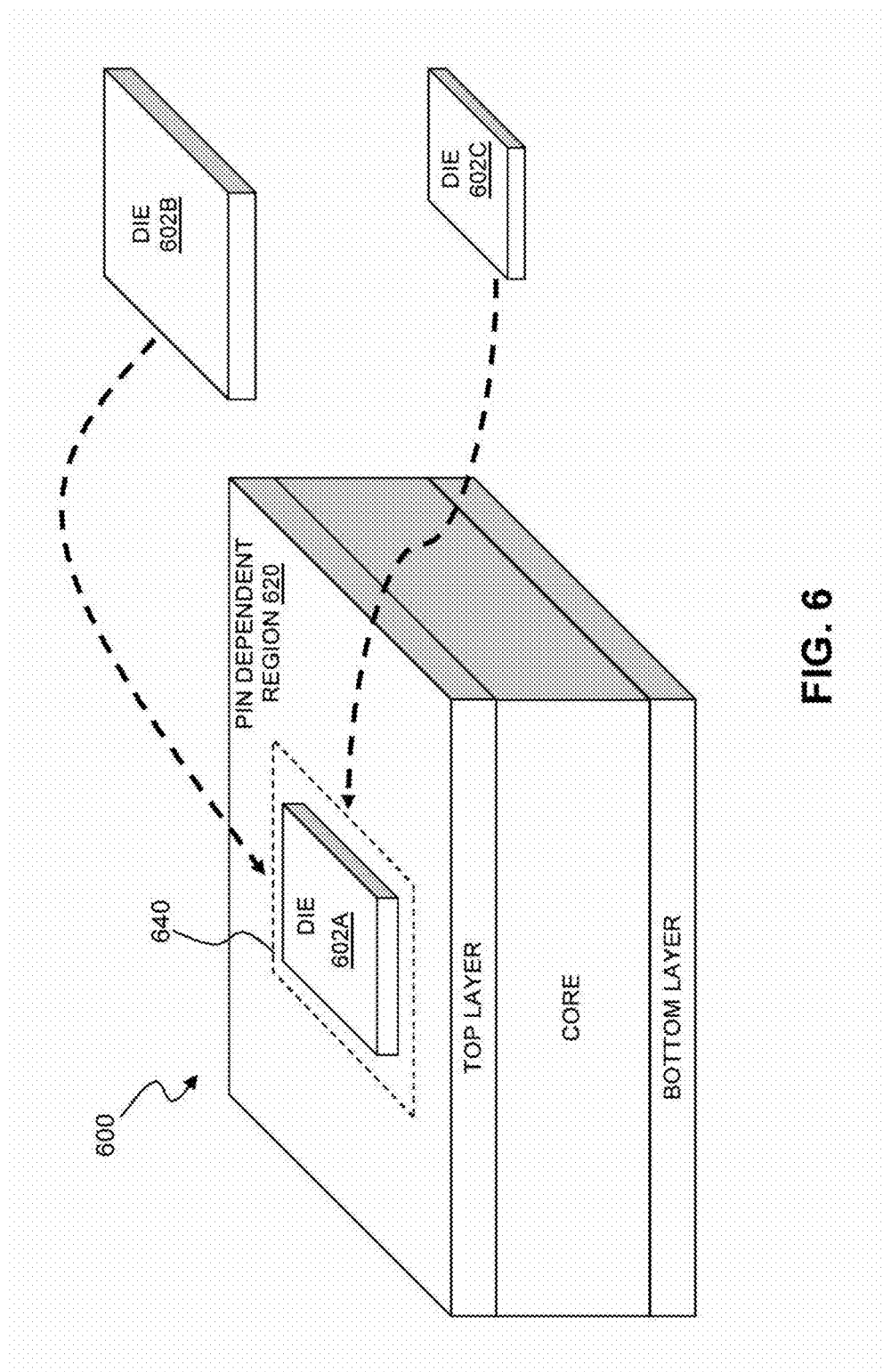
FIG. 6 shows different integrated circuit dies that may be used with a single integrated circuit package substrate in accordance with embodiments of the present invention.

In some scenarios, an IC package substrate may accommodate different IC dies. Instead of migrating an IC die to a different package structure, the same IC package substrate may be used with different IC dies (that is, different IC dies may share the same packaging configuration). FIG. 6 shows different IC dies that may be used with a single IC package substrate in accordance with embodiments of the present invention. As shown in FIG. 6, IC package substrate 600 may be a multi-layer substrate with pin dependent region 620 and die dependent region 640. As explained above with reference to FIGS. 2B and 4, interconnects in pin dependent region 620 may correspond with output pins (not shown in FIG. 6) on IC package substrate 600 while interconnects in die dependent region 640 may correspond with interconnects on an IC die that is associated with IC package substrate 600.

In one embodiment, pin dependent region 620 may be considered a common region as IC dies 602A, 602B and 602C may share a common routing template for pin dependent region 620 on IC package substrate 600. Accordingly, instead of rerouting every interconnect in IC package substrate 600 for every different IC die (e.g., either IC die 602A, 602B or 602C), the package designer may need to reroute only a portion of the interconnects (e.g., interconnects in die dependent region 640) on IC package substrate 600.

As an example, the package designer may route a portion of the interconnects in IC package substrate 600 (e.g., interconnects in die dependent region 640) based on interconnects on a selected IC die. In one scenario, assuming three different IC dies 602A, 602B and 602C have the same (or otherwise identical) packaging configuration, the package designer may first route a portion of the interconnects in IC package substrate 600 based on the largest IC die or the IC die with the maximum dimension (e.g., IC die 602B) to obtain a die dependent routing template for that IC die. As such, the surface area of die dependent region may correspond with the surface area of the largest IC die.

Interconnects that are routed based on the largest IC die may be considered die dependent interconnects (e.g., interconnects in die dependent region 640) while the remaining interconnects are considered pin dependent interconnects (e.g., interconnects in pin dependent region 620). Accordingly, pin dependent interconnects are routed based on output pins on IC package substrate 600 to create a pin dependent routing template. In this scenario, the pin dependent routing template may be a common routing template that may be reused when the package designer designs IC package substrate 600 for a different IC die (e.g., either IC die 602A or 602C). As such, the IC designer may not need to reroute interconnects in pin dependent region 620 and may need to only reroute a portion of the interconnects in die dependent region 640. As shown in FIG. 6, when a smaller IC die (e.g., 602A) is used, the package designer may only need to reroute interconnects in die dependent region 640 that do not correspond with any interconnects on the smaller IC die. In one scenario, the interconnects may be rerouted to interface between the interconnects that correspond with interconnects on the IC die and interconnects in pin dependent region 620.

Figure 7:
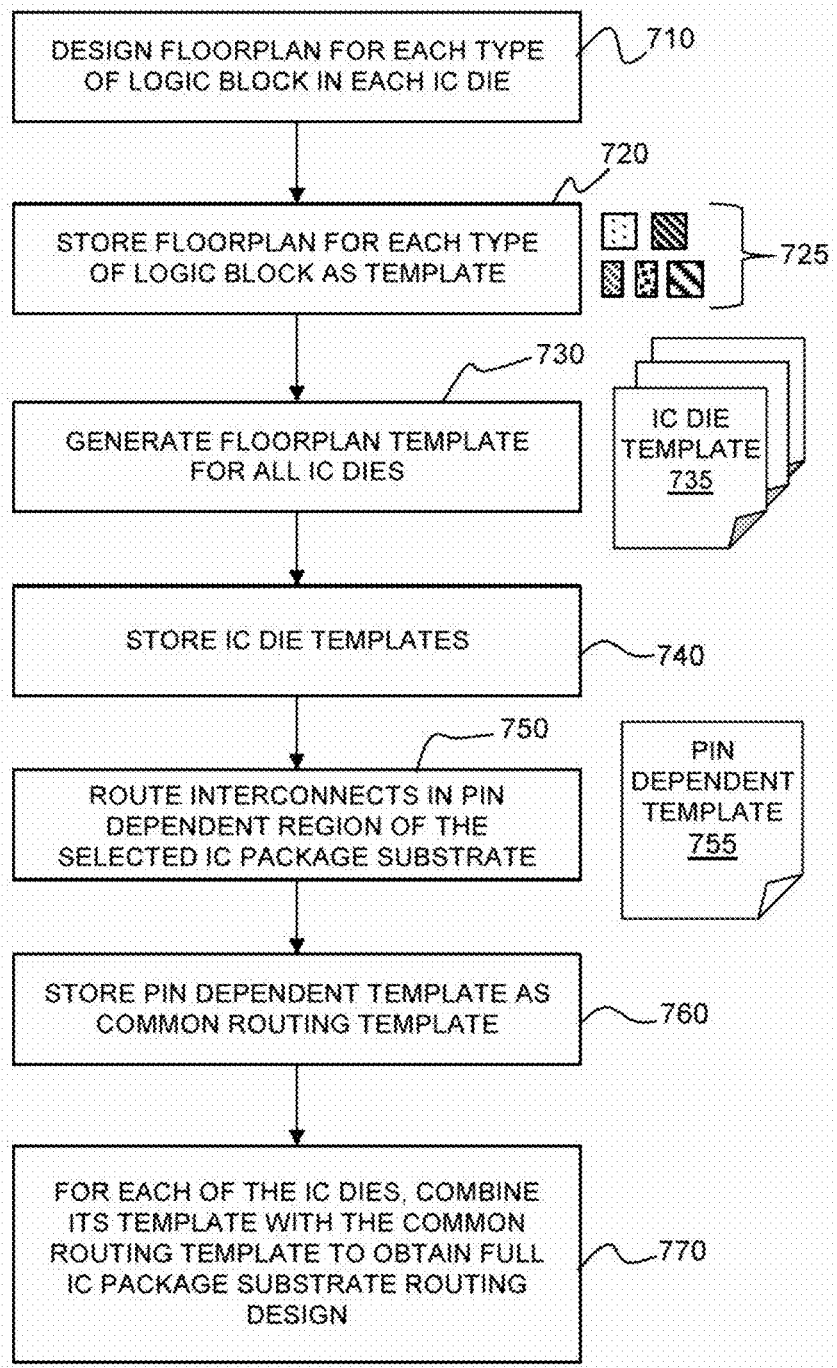
FIG. 7 shows illustrative steps for designing or routing interconnects for different integrated circuit dies using the same package configuration in accordance with embodiments of the present invention.

FIG. 7 shows illustrative steps for designing or routing interconnects for different integrated circuit dies using the same package configuration in accordance with embodiments of the present invention. It should be noted that a package designer may perform some or all of the steps in FIG. 7 when packaging different IC dies in a similar packaging configuration as described above with reference to FIG. 6. As shown in FIG. 6, the IC package substrate may have a pin dependent region and a die dependent region.

At step 610, the package designer may identify the types of logic blocks in each of the different IC dies to be packaged with the same package configuration and may accordingly generate or design a floorplan for each type of logic block in each of the IC dies. The floorplan for each type of logic block may be stored as templates (e.g., templates 725 for the different types of logic blocks) for logic blocks in the respective IC dies.

At step 730, different floorplans or routing templates (e.g., IC die routing templates 735) may be generated for the respective IC dies. In one embodiment, the IC dies may share similar architecture or logic resources and as such, the package designer may first generate an IC die routing template for the largest IC die among all the different IC dies. Individual routing templates for the remaining IC dies may then be generated based on the IC die routing template for the largest IC die. The individual IC die routing templates 735 may be stored as die dependent routing templates at step 740.

Additionally, interconnects on the IC package substrate that are associated with the largest IC die may be referred to as die dependent interconnects (e.g., interconnects in die dependent region 640 of FIG. 6) and interconnects that are associated with output pins on the IC package substrate may be referred to as pin dependent interconnects (e.g., interconnects in pin dependent region 620 of FIG. 6). As such, the package designer may route the pin dependent interconnects based on output pins on the IC package substrate to generate a pin dependent routing template 755. Pin dependent routing template 755 may be stored as a common routing template at step 760.

When different IC dies are to be packaged in the same packaging configuration, the package designer may then combine the common routing template with the respective individual IC die routing templates 735 to obtain full IC package substrate routing designs for the respective IC dies. As such, instead of completely redesigning and routing all the interconnects in the IC package substrate every time a different IC die is used, the package designer may reuse the common routing template to route the pin dependent interconnects in the IC package substrate.

The embodiments, thus far, were described with respect to programmable logic circuits. The method and apparatus described herein may be incorporated into any suitable circuit. For example, the method and apparatus may also be incorporated into numerous types of devices such as microprocessors or other ICs. Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

The foregoing is merely illustrative of the principles of this invention and various modifications can be made by those skilled in the art without departing from the scope and spirit of the invention.

What is claimed is:

1. A method of designing a plurality of integrated circuit package substrates, wherein each integrated circuit package substrate of the plurality of integrated circuit package substrates comprises a die dependent region and a pin dependent region, the method comprising:
routing interconnects in the die dependent region based on an integrated circuit die associated with the plurality of integrated circuit package substrates to obtain a single die dependent routing template common to each integrated circuit package substrate of the plurality of integrated circuit package substrates; and
for each integrated circuit package substrate of the plurality of integrated circuit package substrates, routing interconnects in the pin dependent region to obtain a respective pin dependent routing template for each integrated circuit package substrate, wherein a first pin dependent routing template associated with one of the plurality of integrated circuit package substrates is different from a second pin dependent routing template associated with another one of the plurality of integrated circuit package substrates.

2. The method defined in claim 1, wherein the die dependent region comprises a common region across the plurality of integrated circuit package substrates, the method further comprising:
storing the die dependent routing template as a common routing template for the plurality of integrated circuit package substrates; and
storing respective pin dependent routing templates for the plurality of integrated circuit package substrates.

3. The method defined in claim 2, wherein routing interconnects in the die dependent region comprises:
identifying types of logic blocks in the integrated circuit die; and
for each type of logic block of the identified logic block types, generating a floorplan for that identified logic block type, wherein the common routing template includes the floorplan for each type of logic block of the identified logic block types.

4. The method defined in claim 2 further comprising:
combining the pin dependent routing template for each integrated circuit package substrate of the plurality of integrated circuit package substrate with the common routing template to obtain respective complete routing designs for the plurality of integrated circuit package substrates.

5. A method of designing integrated circuit packages substrates for a single integrated circuit die, wherein each of the integrated circuit package substrates has first and second regions, the method comprising:
generating a first routing template common to the first region in each of the integrated circuit package substrates by routing interconnects that correspond with input-output pins on the single integrated circuit die;
generating a second routing template for the second region of a first one of the integrated circuit package substrates by routing interconnects that correspond with input-output pins on the first one of the integrated circuit package substrates; and
generating a third routing template that is different from the second routing template for the second region of a second one of the integrated circuit package substrates by routing interconnects that correspond with input-output pins on the second one of the integrated circuit package substrates.

6. The method defined in claim 5, further comprising:
generating a full routing template for the first one of the integrated circuit package substrates by combining the first routing template and the second routing template.

7. The method defined in claim 6, further comprising:
generating a full routing template for the second one of the integrated circuit package substrates by combining the first routing template and the third routing template.

8. The method defined in claim 5, wherein the integrated circuit package substrates each comprises a multilayer integrated circuit package substrate having a top layer and a bottom layer, and wherein generating the second routing template for the first one of the integrated circuit package substrates comprises:
routing interconnects in the second region of the first one of the integrated circuit package substrates that correspond with input-output pins formed on the bottom layer of the first one of the integrated circuit package substrates.

9. The method defined in claim 8, wherein generating the first routing template comprises:
routing interconnects that correspond with the input-output pins on the single integrated circuit die on the top layer of each of the integrated circuit package substrates.

10. Integrated circuit package substrates for a single integrated circuit die, wherein each of integrated circuit package substrates comprises:
a first region common to all of the integrated circuit package substrates having interconnects that correspond with input-output pins on the single integrated circuit die; and
a second region having additional interconnects that correspond with input-output pins for each of the respective integrated circuit package substrates, wherein the input-output pins on a first one of the integrated circuit package substrates are different from the input-output pins of a second one of the integrated circuit package substrates, and wherein the second region associated with the first one of the integrated package substrates is different from the second region associated with the second one of the integrated circuit package substrates.

11. The integrated circuit package substrates defined in claim 10, wherein the first one of the integrated circuit package substrates comprises a multilayer integrated circuit package substrate having a top layer and a bottom layer, wherein the first region common to all of the integrated circuit package substrates is in the top layer, and wherein the input-output pins for each of the integrated circuit package substrates are on the respective bottom layers of each of the integrated circuit package substrates.

12. The integrated circuit package substrates defined in claim 11, wherein each of the integrated circuit package substrates has a common layer count.

13. The integrated circuit package substrates defined in claim 10, wherein the input-output pins on the single integrated circuit die comprise microbumps, and wherein the input-output pins on the integrated circuit package substrates comprise solder balls on the integrated circuit package substrates.

14. The integrated circuit package substrates defined in claim 10, wherein a first surface area of the second region of the first one of the integrated circuit package substrates is different from a second surface area of the second region of the second one of the integrated circuit package substrates.

15. The integrated circuit package substrates defined in claim 10, wherein a surface area of the first region common to all of the integrated circuit package substrates corresponds to a surface area of the single integrated circuit die.

* * * * *